United States Patent
Sugiyama et al.

(10) Patent No.: US 8,512,601 B2
(45) Date of Patent: Aug. 20, 2013

(54) PASTE COMPOSITION FOR SOLAR CELL ELECTRODE

(75) Inventors: Takahiro Sugiyama, Miyoshi (JP); Atsushi Nagai, Miyoshi (JP); Ayumi Murakami, Miyoshi (JP)

(73) Assignee: Noritake Co., Limited, Nagoya (JP)

( * ) Notice: Subject to any disclaimer, the term of this patent is extended or adjusted under 35 U.S.C. 154(b) by 90 days.

(21) Appl. No.: 13/203,359

(22) PCT Filed: Jan. 28, 2010

(86) PCT No.: PCT/JP2010/051174
§ 371 (c)(1),
(2), (4) Date: Aug. 25, 2011

(87) PCT Pub. No.: WO2010/098167
PCT Pub. Date: Sep. 2, 2010

(65) Prior Publication Data
US 2011/0309312 A1    Dec. 22, 2011

(30) Foreign Application Priority Data
Feb. 25, 2009  (JP) ................ 2009-043154

(51) Int. Cl.
*H01B 1/22*  (2006.01)
(52) U.S. Cl.
USPC ........................................ 252/514
(58) Field of Classification Search
USPC ................................. 252/512–514
See application file for complete search history.

(56) References Cited

U.S. PATENT DOCUMENTS

| | | | |
|---|---|---|---|
| 4,235,644 A | 11/1980 | Needes | |
| 5,151,377 A | 9/1992 | Hanoka et al. | |
| 5,358,666 A * | 10/1994 | Sasaki | 252/512 |
| 5,363,271 A * | 11/1994 | Pepin | 361/320 |
| 5,985,183 A * | 11/1999 | Hori et al. | 252/519.13 |
| 6,406,646 B1 * | 6/2002 | Lee et al. | 252/514 |
| 2006/0231804 A1 | 10/2006 | Wang et al. | |

FOREIGN PATENT DOCUMENTS

| | | |
|---|---|---|
| JP | A-56-36172 | 4/1981 |
| JP | A-58-79837 | 5/1983 |
| JP | B2-3-46985 | 7/1991 |
| JP | A-5-506753 | 9/1993 |
| JP | A-11-329072 | 11/1999 |
| JP | A-2003-165744 | 6/2003 |
| JP | B2-3707715 | 8/2005 |
| JP | A-2006-93433 | 4/2006 |
| JP | A-2006-302890 | 11/2006 |
| JP | A-2007-281023 | 10/2007 |
| JP | A-2008-520094 | 6/2008 |
| JP | A-2008-159917 | 7/2008 |

OTHER PUBLICATIONS

International Search Report issued in International Application No. PCT/JP2010/051174 on May 11, 2010 (with translation).

* cited by examiner

*Primary Examiner* — Mark Kopec
(74) *Attorney, Agent, or Firm* — Oliff & Berridge, PLC

(57) ABSTRACT

It is provided a paste composition for a solar cell electrode containing a conductive powder, a glass frit, and a vehicle, the glass frit being made of glass containing PbO, $B_2O_3$, and $SiO_2$ at proportions within ranges of 46 to 57 (mol %), 1 to 7 (mol %), and 38 to 53 (mol %), respectively, in terms of oxide.

4 Claims, 3 Drawing Sheets

US 8,512,601 B2

PASTE COMPOSITION FOR SOLAR CELL ELECTRODE

TECHNICAL FIELD

The present invention relates to a paste composition suitable for a solar cell electrode formed with a fire-through method.

BACKGROUND ART

For example, a typical silicon-based solar cell has a configuration including an antireflection film and a light-receiving surface electrode via an $n^+$ layer on the upper surface of a silicon substrate of p-type polycrystalline semiconductor and including a back surface electrode (hereinafter simply "electrode" when no distinction is made between these electrodes) via a $p^+$ layer on the lower surface. The antireflection film is for the purpose of reducing a surface reflectance while maintaining a sufficient visible light transmittance and is made of a thin film of silicon nitride, titanium dioxide, silicon dioxide, etc.

The light-receiving surface electrode of the solar cell is formed with a method called fire-through, for example. In this electrode forming method, for example, after the antireflection film is disposed on the entire surface of the $n^+$ layer, a conductive paste is applied in an appropriate shape onto the antireflection film by using a screen printing method, for example, and is subjected to a firing (sintering) treatment. This method simplifies the operation as compared to the case of partially removing the antireflection film to form an electrode in the removed portion and eliminates a problem of displacement between the removed portion and the electrode forming position. The conductive paste consists mainly of, for example, a silver powder, a glass frit (flaky or powdery fragments of glass formed by melting, quenching, and, if needed, crushing a glass raw material), an organic vehicle, and an organic solvent and, since a glass component in the conductive paste breaks the antireflection film in the course of the firing, an ohmic contact is formed between the conductive component in the conductive paste and the $n^+$ layer (see, e.g., Patent Document 1).

Various proposals have hitherto been made in such a solar cell light-receiving surface electrode formation for a purpose such as enhancing the fire-through property to improve the ohmic contact and consequently to increase a fill factor (FF) and energy conversion efficiency. For example, the group five elements such as phosphorus are added to the conductive paste to promote the oxidation-reduction effect of glass and silver to the antireflection film, improving the fire-through property (see, e.g., Patent Document 1 above). Chloride, bromide, or fluoride is added to the conductive paste to assist the effect of glass and silver breaking the antireflection film with these additives, improving the ohmic contact (see, e.g., Patent Document 2).

It is also proposed for a silver-containing paste containing 85 to 99 (wt %) of silver and 1 to 15 (wt %) of glass that the glass has a composition containing 15 to 75 (mol %) of PbO and 5 to 50 (mol %) of $SiO_2$ and not containing $B_2O_3$ (see, e.g., Patent Document 4). This silver-containing paste is used for the solar cell electrode formation and the ohmic contact is considered to be improved by using the glass having the composition described above.

A thick film conductive composition is also proposed that contains a silver powder, a zinc-containing additive, and a glass frit having a softening point within a range of 300 to 600 (degrees C.) dispersed in an organic solvent (see, e.g., Patent Document 5). This thick film conductive composition is for the purpose of forming a light-receiving surface electrode of a solar cell, and the conductivity and the solder adherence property are improved by adding zinc.

A conductive paste for a solar cell element is also proposed that contains glass frit containing zinc oxide and lead oxide within ranges of 40 to 70 (wt %) and 1 to 10 (wt %), respectively, and a conductive material such as silver (see, e.g., Patent Document 6). Since this paste can ensure an adhesive strength without coating an electrode surface with solder etc., a highly reliable electrode layer can be produced with high productivity.

PRIOR ART DOCUMENTS

Patent Documents

Patent Document 1: Japanese Examined Patent Application Publication No. 03-046985
Patent Document 2: Japanese Patent Publication No. 3707715
Patent Document 3: Japanese Laid-Open Patent Publication No. 11-329072
Patent Document 4: Japanese Unexamined Patent Application Publication (Translation of PCT Application) No. 2008-520094
Patent Document 5: Japanese Laid-Open Patent Publication No. 2006-302890
Patent Document 6: Japanese Laid-Open Patent Publication No. 2007-281023

SUMMARY OF THE INVENTION

Problem to be Solved by the Invention

A firing temperature greatly affects a solar cell output in the solar cell fabrication utilizing the fire-through method as described above. If a firing profile deviates from an optimum firing temperature for generating a light-receiving surface electrode from a paste for an electrode, the effect of glass and silver breaking the antireflection film is reduced and the ohmic contact consequently deteriorates between the light-receiving surface electrode and the $n^+$ layer, resulting in the reduction of the solar cell output. However, since a conventional paste for an electrode has a small range of optimum firing temperature, for example, about 10 (degrees C.) or lower, it is difficult to certainly acquire a high-output solar cell. The same applies to the various proposals for improving the ohmic contact as described above. The optimum firing temperature in this case is a temperature at which the maximum value of the fill factor can be acquired.

In the current silicon solar cell fabrication, respective thickness dimensions etc., of a silicon substrate, an antireflection film, and an $n^+$ layer vary from one substrate to another and, as a result, the optimum firing condition varies for each substrate. Although the maximum value of the fill factor is acquired in a sufficiently wide temperature range in individual substrates, an optimum firing temperature range of each lot is determined within an overlapping range of the optimum firing temperature ranges of individual substrates in a production lot and becomes narrower due to the variations. A tact time of the solar cell fabrication operation is about three seconds per substrate and is extremely short and, therefore, the firing condition cannot be optimized in consideration of the variations of each substrate.

The present invention was conceived in view of the situations and it is therefore an object of the present invention to provide a paste composition for a solar cell electrode having a wider optimum firing temperature range in the firing operation of the solar cell fabrication.

Means for Solving Problem

The object indicated above may be achieved according to the present invention, which provides a paste composition for a solar cell electrode containing a conductive powder, a glass frit, and a vehicle, (a) the glass frit being made of glass containing PbO, $B_2O_3$, and $SiO_2$ at proportions within ranges of 46 to 57 (mol %), 1 to 7 (mol %), and 38 to 53 (mol %), respectively, in terms of oxide.

Effects of the Invention

According to the present invention, the paste composition for a solar cell electrode has the constituent glass frit made of the glass containing PbO, $B_2O_3$, and $SiO_2$ in ratios within the ranges of 46 to 57 (mol %), 1 to 7 (mol %), and 38 to 53 (mol %), respectively, and, therefore, the optimum firing temperature range becomes wider in the solar cell having the light-receiving surface electrode formed by using this paste. For example, the optimum firing temperature range of each production lot is expanded to about 30 to 40 (degrees C.). As a result, since the fire-through property is enhanced and the ohmic contact is improved, an average output per production lot is increased.

In the glass frit composition, PbO is a component that lowers the softening point of glass and is essential for enabling low-temperature firing. In the present invention, PbO must be equal to or greater than 46 (mol %) and equal to or less than 57 (mol %) to acquire favorable fire-through property. The amount of PbO is more preferably equal to or greater than 49 (mol %) and more preferably equal to or less than 54 (mol %). Therefore, the range of 49 to 54 (mol %) is further preferred.

$B_2O_3$ is a glass forming oxide (i.e., a component that makes up a skeleton of glass) and is a component essential for lowering the softening point of glass. In the present invention, $B_2O_3$ must be equal to or greater than 1 (mol %) and equal to or less than 7 (mol %) to acquire favorable fire-through property. The amount of $B_2O_3$ is more preferably equal to or greater than 3 (mol %) and more preferably equal to or less than 5 (mol %). Therefore, the range of 3 to 5 (mol %) is further preferred.

$SiO_2$ is a glass forming oxide and is a component essential for increasing the chemical resistance of glass. In the present invention, $SiO_2$ must be equal to or greater than 38 (mol %) and equal to or less than 53 (mol %) to acquire favorable fire-through property. The amount of $SiO_2$ is more preferably equal to or greater than 43 (mol %) and more preferably equal to or less than 48 (mol %). Therefore, the range of 43 to 48 (mol %) is further preferred.

Although what form the components are contained in glass is not necessarily easily identified, all of these proportions are defined as oxide-converted values.

The glass making up the paste for an electrode of the present invention may contain other various glass constituent components and additives within a range not deteriorating the characteristics thereof. For example, Al, Zr, Na, Li, Ca, Zn, Mg, K, Ti, Ba, Sr, etc., may be contained. These components and additives may be contained within a range of a total of 10 (mol %) or less, for example.

The Patent Document 3 describes a conductive paste having glass frit made of glass containing 20 (mol %) or more of $Bi_2O_3$, 50 (mol %) or less of $B_2O_3$, and 60 (mol %) or less of $SiO_2$. This conductive paste is for the purpose of improving poor wettability and lack of connection reliability of lead glass when a lead terminal etc., are attached by using lead-free solder. Although proposals have hitherto been made as described above that focus attention on a composition of the glass frit making up a conductive paste as is the case with the present invention, the conductive paste is completely different in purpose and composition from the paste for an electrode of the present invention.

Preferably, the glass frit has an average particle diameter within a range of 0.5 to 3 (μm). As a result, the paste composition for a solar cell electrode can be acquired that achieves more favorable printability and a higher FF value. If an average particle diameter is equal to or greater than 0.5 (μm), the dispersibility at the time of preparation of the paste becomes more excellent and favorable printability is consequently acquired. On the other hand, since a larger average particle diameter of the glass frit makes glass difficult to melt and tends to lower the FF value, it is preferred that the average particle diameter be equal to or less than 3 (μm) to acquire a sufficiently high FF value.

Preferably, the paste composition for a solar cell electrode contains the glass frit at a proportion within a range of 7 to 35 (vol %) relative to the whole paste. As a result, since the antireflection film is preferably melt by the glass frit in the paste, a more favorable ohmic contact is acquired and the FF value is further increased. If 7 (vol %) or more of the glass frit is contained, the meltability of the antireflection film becomes extremely high and, therefore, the optimum firing temperature range becomes wider. In the case of 35 (vol %) or less, an insulation layer is hardly formed and, therefore, higher electrical conductivity is ensured between the electrode and the substrate.

Preferably, the conductive powder is a silver powder. Although a copper powder, a nickel powder, etc., may be used as the conductive powder, the silver powder is most preferred since higher electrical conductivity can be acquired.

Preferably, the paste composition for a solar cell electrode contains the silver powder and the vehicle at proportions within ranges of 64 to 90 parts by weight and 5 to 20 parts by weight, respectively. As a result, a conducive composition can be acquired that has favorable printability and high electric conductivity and that enables the fabrication of an electrode having favorable solder wettability. If the silver powder is too small in amount, the high electric conductivity cannot be acquired, and an excess of the silver powder lowers flowability and deteriorates printability. If the glass frit is too small in amount, the adhesion to the substrate becomes insufficient, and an excess of the glass frit deteriorates the solder wettability since glass floats on the electrode surface after the firing.

The silver powder is not particularly limited and the powder of any shape such as a spherical shape or a scale shape may be used for enjoying the expansion of the optimum firing temperature range, which is the basic effect of the present invention. However, for example, if the powder forming a spherical shape is used, since excellent printability is achieved and a filling rate of the silver powder is increased in an applied film and additionally because highly-conductive silver is used, the electric conductivity of the electrode made of the applied film is increased as compared to the case of using the silver powder of another shape such as a scale shape. As a result, a line width can be made narrower while ensuring necessary electric conductivity. Therefore, if this conductive composition is applied to the light-receiving surface electrode to make a line width narrower, a light-receiving area capable of absorbing the solar energy can further be increased and a solar cell having higher conversion efficiency can be acquired.

Since the dispersion of silver may preferably be controlled at the time of the electrode formation with fire-through as described above, the conductive composition of the present invention may preferably be used for the light-receiving surface electrode. However, the conductive composition is applicable not only to the light-receiving electrode but also to a rear surface electrode. For example, the rear surface electrode is made of an aluminum film entirely covering the surface and an electrode in a shape like a belt etc., overlapping with the aluminum film, and the conductive composition is preferred for a constituent material of the belt-like electrode.

Although the glass frit can be synthesized from various vitrifiable raw materials within the composition range including, for example, oxide, carbonate, nitrate, etc., silicon dioxide $SiO_2$, boron oxide $B_2O_3$, and minimum $Pb_3O_4$ may be used as sources of Si, B, and Pb, respectively, for example.

If the composition includes other components such as Al and Zr in addition to the main components Si, B, and Pb, oxide, hydroxide, carbonate, nitrate, etc., thereof may be used, for example.

MODES FOR CARRYING OUT THE INVENTION

An embodiment of the present invention will now be described in detail with reference to the drawings. In the following embodiment, diagrams are simplified or modified as needed and dimensional ratios and shapes of portions are not necessarily exactly depicted.

Figure 1:
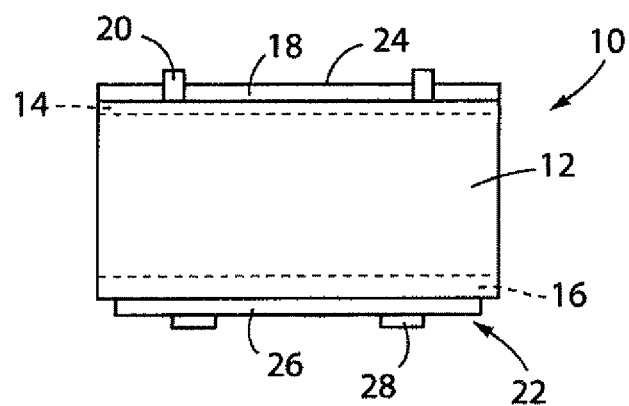
FIG. 1 is a schematic of a cross section structure of a solar cell to which a paste composition for an electrode of one embodiment of the present invention is applied in the formation of a light-receiving surface electrode.

FIG. 1 is a schematic of a cross section structure of a silicon solar cell 10 to which a conductive composition of one embodiment of the present invention is applied. In FIG. 1, the solar cell 10 includes, for example, a silicon substrate 12 of p-type polycrystalline semiconductor, an $n^+$ layer 14 and a $p^+$ layer 16 formed respectively on the upper and lower surfaces thereof, an antireflection film 18 and a light-receiving surface electrode 20 formed on the $n^+$ layer 14, and a rear surface electrode 22 formed on the $p^+$ layer 16.

The $n^+$ layer 14 and the $p^+$ layer 16 are disposed by forming layers having high impurity concentrations on the upper and lower surfaces of the silicon substrate 12, and the thickness dimensions of the high concentration layers, i.e., the thickness dimensions of the layers 14 and 16 are both about 0.5 ($\mu m$), for example. The impurity contained in the $n^+$ layer 14 is phosphorus (P) that is an n-type dopant, for example, and the impurity contained in the $p^+$ layer 16 is boron (B) that is a p-type dopant, for example.

The antireflection film 18 is, for example, a thin film made of silicon nitride $Si_3N_4$ etc., and is disposed with an optical thickness on the order of ¼ of the visible light wavelength, for example, to have an extremely low reflectance equal to or less than 10(%), for example, on the order of 2(%).

Figure 2:
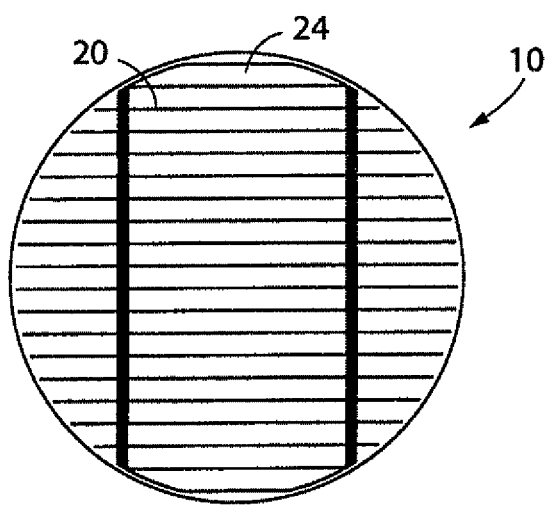
FIG. 2 is a diagram of an example of a light-receiving surface electrode pattern of the solar cell of FIG. 1.

The light-receiving surface electrode 20 is made of a thick film conductor having a uniform thickness dimension, for example, and is disposed in a comb-like planar shape having a multiple of thin line portions on substantially the entire surface of a light-receiving surface 24 as shown in FIG. 2. The thick film conductor is made of a thick film silver containing about 67 to 98 (wt %) of Ag and about 2 to 33 (wt %) of glass and the glass is lead glass containing PbO, $B_2O_3$, and $SiO_2$ at proportions within ranges of 46 to 57 (mol %), 1 to 7 (mol %), and 38 to 53 (mol %), respectively, in terms of oxide-converted values. The thickness dimension of the conductive layer is, for example, within a range of 15 to 20 ($\mu m$), for example, about 17 ($\mu m$), and the width dimension of each of the thin line portions is, for example, within a range of 80 to 130 ($\mu m$), for example, about 100 ($\mu m$). Then, the conductive layer has sufficiently high electric conductivity.

The rear surface electrode 22 is made up of an entire surface electrode 26 formed by applying a thick film material having aluminum as a conductive component on substantially the entire surface of the $p^+$ layer 16 and a belt-like electrode 28 made of a thick film silver formed by the application in a belt shape onto the entire surface electrode 26. The belt-like electrode 28 is disposed for the purpose of enabling soldering of conductive wires etc., to the rear surface electrode 22.

Since the solar cell 10 configured as above has the light-receiving surface electrode 20 made of the thick film silver containing the lead glass of the composition described above within a range of 2 to 33 (wt %) as described above, the solar cell 10 advantageously has a greater firing margin as compared to solar cells using various glasses conventionally used.

The light-receiving surface electrode 20 as described above is formed by using a paste for an electrode consisting of a conductive powder, a glass frit, a vehicle, and a solvent, for example, with a well-known fire-through method. An example of a fabrication method of the solar cell 10 including the light-receiving surface electrode formation will hereinafter be described together with a fabrication method of a conductive composition of comparative examples.

First, the glass frit is manufactured. Silicon dioxide $SiO_2$, boron oxide $B_2O_3$, minimum $Pb_3O_4$, aluminum oxide $Al_2O_3$, zirconium oxide $ZrO_2$, sodium oxide $Na_2O$, lithium oxide $Li_2O$, calcium oxide CaO, zinc oxide ZnO, and magnesium oxide MgO were prepared as sources of Si, B, Pb, Al, Zr, Na, Li, Ca, Zn, and Mg, respectively, and were weighed and blended so as to achieve compositions described in Table 1. These were put into a crucible and melted and vitrified for about 30 minutes to one hour at a temperature within a range of 900 to 1100 (degrees C.) depending on the compositions. The acquired glass was crushed by using a suitable crushing device such as a pot mill to acquire powders having average particle diameters of 0.4 ($\mu m$), 0.6 ($\mu m$), 1.5 ($\mu m$), 3.0 ($\mu$), and 4.0 ($\mu m$).

TABLE 1

| | Glass Frit Composition [mol %] | | | | | | | | | | Particle Diameter [μm] | Additive Amount [vol %] | FF Maximum Value [%] | Firing Margin [degree C.] |
|---|---|---|---|---|---|---|---|---|---|---|---|---|---|---|
| | PbO | B$_2$O$_3$ | SiO$_3$ | Al$_2$O$_3$ | ZrO$_2$ | Na$_2$O | Li$_2$O | CaO | ZnO | MgO | | | | |
| Embodiment1 | 46 | 1 | 53 | — | — | — | — | — | — | — | 1.5 | 14 | 74 | 30 |
| Embodiment2 | 46 | 3 | 51 | — | — | — | — | — | — | — | 1.5 | 14 | 74 | 30 |
| Embodiment3 | 46 | 2 | 52 | — | — | — | — | — | — | — | 1.5 | 14 | 74 | 30 |
| Embodiment4 | 55 | 7 | 38 | — | — | — | — | — | — | — | 1.5 | 14 | 74 | 30 |
| Embodiment5 | 50 | 2 | 48 | — | — | — | — | — | — | — | 1.5 | 14 | 74 | 30 |
| Embodiment6 | 57 | 1 | 42 | — | — | — | — | — | — | — | 1.5 | 14 | 74 | 30 |
| Embodiment7 | 49 | 3 | 48 | — | — | — | — | — | — | — | 1.5 | 14 | 75 | 40 |
| Embodiment8 | 54 | 3 | 43 | — | — | — | — | — | — | — | 1.5 | 14 | 75 | 40 |
| Embodiment9 | 52 | 4 | 44 | — | — | — | — | — | — | — | 1.5 | 14 | 75 | 40 |
| Embodiment10 | 50 | 5 | 45 | — | — | — | — | — | — | — | 1.5 | 14 | 75 | 40 |
| Embodiment11 | 49 | 5 | 44 | 3 | — | — | — | — | — | — | 1.5 | 14 | 75 | 40 |
| Embodiment12 | 48 | 5 | 43 | 2 | 3 | — | — | — | — | — | 1.5 | 14 | 75 | 40 |
| Embodiment13 | 49 | 4 | 42 | — | 5 | — | — | — | — | — | 1.5 | 14 | 75 | 30 |
| Embodiment14 | 46 | 2 | 45 | — | — | — | 7 | — | — | — | 1.5 | 14 | 75 | 30 |
| Embodiment15 | 46 | 3 | 48 | — | — | 3 | — | — | — | — | 1.5 | 14 | 74 | 40 |
| Embodiment16 | 48 | 5 | 45 | — | — | — | — | 2 | — | — | 1.5 | 14 | 75 | 40 |
| Embodiment17 | 48 | 3 | 44 | — | — | — | — | — | — | 5 | 1.5 | 14 | 75 | 40 |
| Embodiment18 | 51 | 4 | 44 | — | — | — | — | — | 1 | — | 1.5 | 14 | 75 | 40 |
| Embodiment19 | 50 | 5 | 45 | — | — | — | — | — | — | — | 1.5 | 7 | 75 | 40 |
| Embodiment20 | 50 | 5 | 45 | — | — | — | — | — | — | — | 1.5 | 35 | 74 | 30 |
| Embodiment21 | 55 | 7 | 38 | — | — | — | — | — | — | — | 0.6 | 14 | 75 | 30 |
| Embodiment22 | 55 | 7 | 38 | — | — | — | — | — | — | — | 1.0 | 14 | 75 | 30 |
| Embodiment23 | 55 | 7 | 38 | — | — | — | — | — | — | — | 3.0 | 14 | 75 | 30 |
| Comparative Example1 | 43 | 6 | 51 | — | — | — | — | — | — | — | 1.5 | 14 | 75 | 5 |
| Comparative Example2 | 65 | 7 | 28 | — | — | — | — | — | — | — | 1.5 | 14 | 53 | — |
| Comparative Example3 | 35 | 3 | 62 | — | — | — | — | — | — | — | 1.5 | 14 | 28 | — |
| Comparative Example4 | 38 | 12 | 50 | — | — | — | — | — | — | — | 1.5 | 14 | 47 | — |
| Comparative Example5 | 62 | 0 | 38 | — | — | — | — | — | — | — | 1.5 | 14 | 74 | 5 |
| Comparative Example6 | 59 | 11 | 30 | — | — | — | — | — | — | — | 1.5 | 14 | 74 | 10 |
| Comparative Example7 | 55 | 14 | 31 | — | — | — | — | — | — | — | 1.5 | 14 | 73 | 10 |
| Comparative Example8 | 48 | 12 | 40 | — | — | — | — | — | — | — | 1.5 | 14 | 73 | 10 |
| Comparative Example9 | 45 | 21 | 34 | — | — | — | — | — | — | — | 1.5 | 14 | 67 | — |
| Comparative Example10 | 69 | 0 | 31 | — | — | — | — | — | — | — | 1.5 | 14 | 43 | — |
| Comparative Example11 | 55 | 32 | 13 | — | — | — | — | — | — | — | 1.5 | 14 | 52 | — |
| Comparative Example12 | 50 | 5 | 45 | — | — | — | — | — | — | — | 1.5 | 5 | 70 | 30 |
| Comparative Example13 | 50 | 5 | 45 | — | — | — | — | — | — | — | 1.5 | 47 | 71 | 30 |
| Comparative Example14 | 55 | 7 | 38 | — | — | — | — | — | — | — | 0.4 | 14 | 72 | 15 |
| Comparative Example15 | 55 | 7 | 38 | — | — | — | — | — | — | — | 4.0 | 14 | 71 | 20 |

The conductive powder was prepared as a commercially available sphere-shaped silver powder having, for example, an average particle diameter within a range of 1 to 3 (μm), for example, about 2 (μm). By using such a silver powder having a sufficiently small average particle diameter, a filling rate of the silver powder is increased in an applied film and the electric conductivity of the conductor can consequently be increased. The vehicle is prepared by dissolving an organic binder in an organic solvent; for example, butyl carbitol acetate is used as the organic solvent; and, for example, ethyl cellulose is used as the organic binder. The proportion of ethyl cellulose in the vehicle is about 15 (wt %), for example. A solvent added separately from the vehicle is butyl carbitol acetate, for example. Although this is not a limitation, the solvent may be the same as that used for the vehicle. This solvent is added for the purpose of adjusting the viscosity of the paste.

The paste raw materials are prepared and, after the conductive powder, the glass frit, the vehicle, and the solvent are weighed to be proportions of 64 to 82 (wt %), 2 to 20 (wt %), 13 (wt %), and 3 (wt %), respectively, for example, and are mixed by using a stirring machine, etc., a dispersion process is executed by a three roll mill, for example. As a result, the paste for an electrode is acquired. In this embodiment, a total amount of the conductive powder and the glass frit is set to 84 (wt %), and a total amount of the vehicle and the solvent is set to 16 (wt %). Table 1 summarizes the compositions of the glass frit, the particle diameters, the additive amounts, and the results of evaluation of the characteristics of the solar cell 10 when the light-receiving surface electrode 20 is formed by using each of the glass frits, in the embodiments and the comparative examples. In Table 1, an amount of glass frit is represented in terms of volume relative to the whole paste.

While the paste for an electrode is prepared as described above, an impurity is dispersed or implanted in an appropriate silicon substrate with, for example, a well-known method such as a thermal diffusion method and ion implantation to form the n⁺ layer 14 and the p⁺ layer 16 to manufacture the silicon substrate 12. A silicon nitride thin film is then formed thereon with, for example, a suitable method such as spin coating to dispose the antireflection film 18.

The paste for an electrode is then screen-printed on the antireflection film 18 in the pattern depicted in FIG. 2. The paste for an electrode is dried at 150 (degrees C.), for example, and is subjected to a firing treatment at a temperature within a range of 760 to 900 (degrees C.) in a near-infrared furnace. As a result, since the glass component in the paste for an electrode melts the antireflection film 18 in the course of the firing and the paste for an electrode breaks the antireflection film 18, an electric contact is achieved between the conductive component, i.e., silver in the paste for an electrode and the n⁺ layer 14 and the ohmic contact is achieved between the silicon substrate 12 and the light-receiving surface electrode 20 as depicted in FIG. 1. The light-receiving surface electrode 20 is formed in this way.

The rear surface electrode 22 may be formed after the above operation or may be formed by firing at the same time as the light-receiving surface electrode 20. When the rear surface electrode 22 is formed, for example, an aluminum paste is applied to the entire rear surface of the silicon substrate 12 with a screen printing method etc., and is subjected to the firing treatment to form the entire surface electrode 26 made of an aluminum thick film. The paste for an electrode is then applied onto the surface of the entire surface electrode 26 in a belt shape by using the screen printing method etc., and is subjected to the firing treatment to form the belt-like electrode 28. As a result, the rear surface electrode 22 is formed that consists of the entire surface electrode 26 covering the entire rear surface and the belt-like electrode 28 disposed on a portion of the surface thereof in a belt shape, and the solar cell 10 is acquired. In the operation described above, in the case of the fabrication with the concurrent firing, the printing process is executed before the firing of the light-receiving surface electrode 20.

The characteristics depicted in the two rightmost fields of Table 1 are the results of the maximum value of the fill factor FF and the firing margin, i.e., a temperature width for obtaining an FF value equal to or more than a value lower only by 1% than the maximum value, which are evaluated by forming the light-receiving surface electrode 20 with the firing temperature varied within the range and measuring the output of the acquired solar cell 10 for each of the embodiments and the comparative examples having the composition of glass, the particle diameter, and the additive amount variously changed in the solar cell 10 acquired as described above. The output of the solar cell 10 is measured by using a commercially available solar simulator.

Although a solar cell is usable if an FF value equal to or greater than 70 is acquired, a higher FF value is naturally more preferable. In the embodiments 1 to 23 of Table 1, an FF value of 74 to 75 is acquired and sufficiently high output can be acquired. In the embodiments 1 to 23, a sufficiently wide firing margin of 30 to 40 (degrees C.) is acquired.

Therefore, according to the evaluation results described in Table 1, if PbO, $B_2O_3$, and $SiO_2$ are within the ranges of 46 to 57 (mol %), 1 to 7 (mol %), and 38 to 53 (mol %), respectively, the FF value is sufficiently high and the firing margin is sufficiently wide. According to the embodiments 11 to 18, even if 3 (mol %) or less of $Al_2O_3$, 5 (mol %) or less of $ZrO_2$, 3 (mol %) or less of $Na_2O$, 7 (mol %) or less of $Li_2O$, 2 (mol %) or less of CaO, 1 (mol %) or less of ZnO, and 5 (mol %) or less of MgO are contained in addition to the main components, the same characteristics can be acquired. According to the embodiments 4 and 21 to 23, if the particulate diameter of the glass frit is within the range of 0.6 to 3.0 (μm), higher characteristics are acquired regardless of the particulate diameter. According to the embodiments 10, 19, and 20, if the additive amount is within the range of 7 to 35 (vol %), higher characteristics are acquired regardless of the additive amount. The amount of the glass corresponds to 3 to 15 (wt %) relative to the whole paste.

The firing margin is a value taking into account the effect of variations of substrate thickness within a production lot on the optimum firing temperature in this embodiment. Therefore, even when the variations of thickness are taken into account, the temperature range for acquiring "FF maximum value-1%" is 30 to 40 (degrees C.), which is sufficiently wide.

In contrast, since at least one of PbO, $B_2O_3$, and $SiO_2$ is out of the preferable range in the comparative examples 1 to 11, the firing margin is not acquired or the FF value becomes lower as a result. For those having the FF maximum value lower than 70 as in the case of the comparative examples 2, 3, etc., the firing margin is not evaluated since these examples do not have a sufficient function as a solar cell.

The comparative examples 12 to 15 have the glass composition falling within the range of the present invention and are available in the solar cell application although the characteristics stay somewhat lower than the comparative examples 1 to 22. Therefore, these examples may be added to the embodiments; however, the examples are classified as comparative examples. Although the comparative examples 12 and 13 have the composition same as the embodiment 10, the additive amount of the glass frit is too small (5 (vol %)) or too large (47 (vol %)) and, therefore, the FF value stays at a somewhat lower value of 70 to 71. However, since this value satisfies the minimum requirements of the solar cell application and the firing margin is 30 (degrees C.) and is sufficiently wide, such a configuration is also included in the present invention. Although the comparative examples 14 and 15 have the composition same as the embodiment 4, the particle diameter of the glass frit is too small (0.4 (μm)) or too large (4.0 (μm)) and, therefore, the FF maximum value is 71 to 72, which is somewhat lower, and the firing margin stays in a narrower range of 15 to 20 (degrees C.). However, since this FF value satisfies the minimum requirements of the solar cell application and the firing margin is considered to be improved from 10 (degrees C.) or less of the comparative examples 1 to 11, such a configuration is also included in the present invention.

According to the embodiments and the comparative examples, if the glass composition making up the glass frit is within the ranges of 46 to 57 (mol %) for PbO, 1 to 7 (mol %) (preferably 3 (mol %) or more) for $B_2O_3$, and 38 to 53 (mol %) for $SiO_2$, the paste for an electrode is acquired that has the FF value equal to or greater than 70 and the firing margin equal to or greater than 15 (degrees C.). If the additive amount of the glass frit is set within the range of 7 to 35 (vol %), a higher FF value can be acquired as compared to the case of the additive amount out of the range. If the particle diameter of the glass frit is set within the range of 0.5 to 30 (μm) (preferably, 0.6 to 3.0 (μm)), the firing margin can be expanded to 30 (degrees C.) or more.

Figure 3:
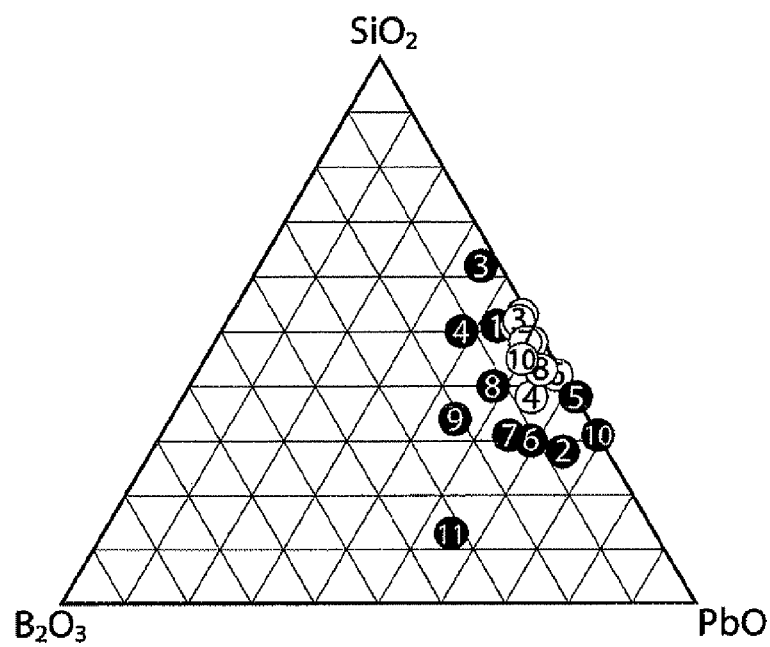
FIG. 3 is a diagram of main component compositions of glass frits used in embodiments and comparative examples, represented in a triangle diagram.
Figure 4:
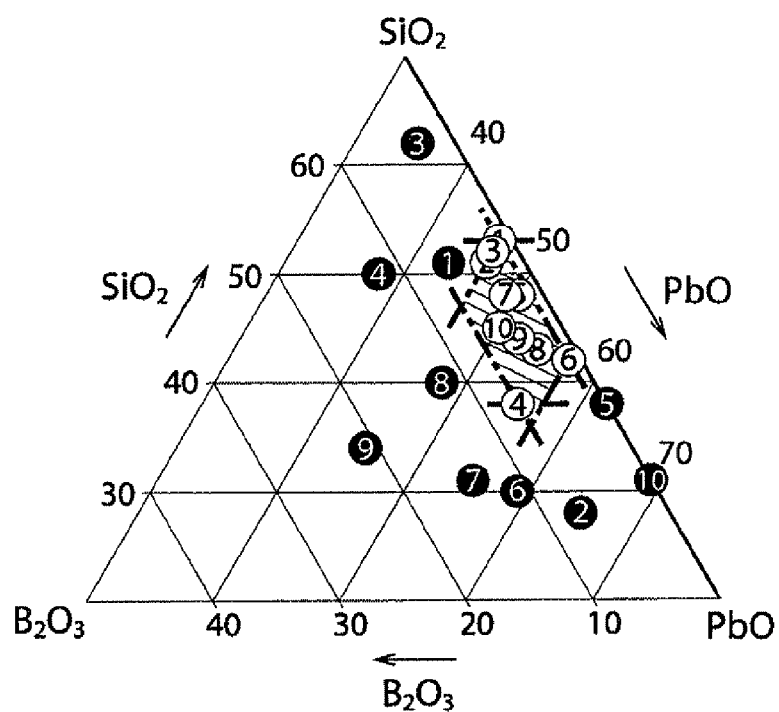
FIG. 4 is an enlarged diagram of an area where the embodiments and the comparative examples are distributed in the triangle diagram of FIG. 3.

FIG. 3 depicts the composition ratios of the main components Pb, B, and Si of the glass frits used in the embodiments 1 to 10 and the comparative examples 1 to 11 depicted in Table 1 on a triangle diagram and FIG. 4 is an enlarged view of an area where the compositions of the embodiments and the comparative examples other than the comparative example 11 are distributed. With regard to the embodiments and the comparative examples other than the above, since the comparative example 11 has a significantly different composition and the others contain other components or have the same composition and different particle diameters or additive amounts, these embodiments and comparative examples are not depicted.

In FIG. 4, a shaded range surrounded by dashed-dotted lines is a composition range of the main components of the present invention. The comparative examples 1 to 10 have the compositions selected to distribute around the range. The comparative examples 1 and 5 to 8 are located relatively closer to the composition range of the embodiments and have the sufficiently high FF maximum values while the firing margins are 5 to 10 (degrees C.), which are narrower. The comparative examples 2 to 4, 9, and 10 are more displaced from the composition range of the embodiments and have the FF maximum values less than 70, which are significantly small. The same applies to the comparative example 11, which is further displaced.

As can be seen from the depicted results, when the composition is displaced from the composition range of the embodiments, the firing margin first narrows, and when the composition is further displaced, the FF maximum value becomes smaller and the object of the present invention cannot be achieved in any case.

Figure 5:
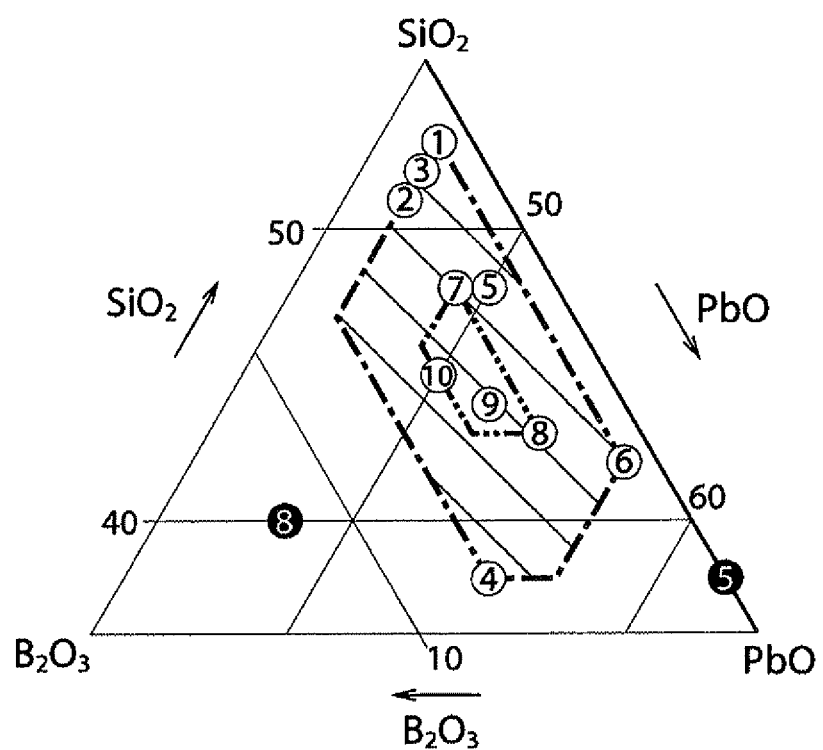
FIG. 5 is a diagram of a preferred range depicted by further enlarging an area where the embodiments are distributed in the triangle diagram of FIG. 3.

FIG. 5 is a further enlarged view of the inside of the range of the embodiments surrounded by dashed-dotted lines of FIG. 4 and the adjacent area thereof. As described in Table 1, the FF value equal to or greater than 74(%) and the firing margin equal to or greater than 30 (degrees C.) are acquired by using the glass frit of any compositions in the range of the embodiments. However, if the glass frit of the compositions within a range surrounded by dashed-two dotted lines depicted in FIG. 5 is used, more preferable results, i.e., the FF value of 75(%) and the firing margin of 40 (degrees C.) are acquired. Therefore, according to the evaluation results depicted in Table 1, it is most preferred to use the glass frit containing PbO, $B_2O_3$, and $SiO_2$ within the ranges of 49 to 54 (mol %), 3 to 5 (mol %), and 43 to 48 (mol %), respectively.

In short, according to this embodiment, the paste for an electrode of the solar cell 10 has the constituent glass frit made of the glass containing PbO, $B_2O_3$, and $SiO_2$ within the ranges of 46 to 57 (mol %), 1 to 7 (mol %), and 38 to 53 (mol %), respectively, and, therefore, the optimum firing temperature range becomes wider in the solar cell 10 having the light-receiving surface electrode 20 formed by using this paste. For example, the optimum firing temperature range of each production lot is expanded to about 30 to 40 (degrees C.).

As a result, since the fire-through property is enhanced and the ohmic contact is improved, an average output per production lot is increased.

Although the present invention has been described in detail with reference to the drawings, the present invention can be implemented in other aspects and may variously be modified within a range not departing from the concept thereof.

For example, although the antireflection film 18 is made of a silicon nitride film in the embodiment, the constituent material is not a limitation and those made of other various materials such as titanium dioxide $TiO_2$ typically used for solar cells may be used in the same way.

Although the case of applying the present invention to the silicon-based solar cell 10 has been described in the embodiment, the present invention is not particularly limited by a substrate material of an object of application as long as a solar cell has a light-receiving surface electrode that can be formed with the fire-through method.

| EXPLANATION OF REFERENCE SIGNS | |
|---|---|
| 10: | solar cell |
| 12: | silicon substrate |
| 14: | $n^+$ layer |
| 16: | $p^+$ layer |
| 18: | antireflection film |
| 20: | light-receiving surface electrode |
| 22: | rear surface electrode |
| 24: | light-receiving surface |
| 26: | entire surface electrode |
| 28: | belt-like electrode |

The invention claimed is:

1. A paste composition for a solar cell electrode containing a conductive silver powder, a glass frit, and a vehicle,
   the glass frit being made of glass containing PbO, $B_2O_3$, and $SiO_2$ at proportions within ranges of 46 to 57 (mol %), 1 to 7 (mol %), and 38 to 53 (mol %), respectively, in terms of oxide.

2. The paste composition for a solar cell electrode of claim 1, wherein the glass frit has an average particle diameter within a range of 0.5 to 3 (μm).

3. The paste composition for a solar cell electrode of claim 1, wherein the glass frit is contained at a proportion within a range of 7 to 35 (vol %) relative to the whole paste.

4. The paste composition for a solar cell electrode of claim 2, wherein the glass frit is contained at a proportion within a range of 7 to 35 (vol %) relative to the whole paste.

* * * * *